(12) United States Patent
Hou et al.

(10) Patent No.: US 9,444,441 B2
(45) Date of Patent: Sep. 13, 2016

(54) ZERO-CROSSING DETECTION CIRCUIT AND METHOD FOR SYNCHRONOUS STEP-DOWN CONVERTER

(71) Applicant: Silergy Semiconductor Technology (Hangzhou) LTD, Hangzhou, ZheJiang Province (CN)

(72) Inventors: Jinzhao Hou, ZheJiang Province (CN); Chen Chen, ZheJiang Province (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 132 days.

(21) Appl. No.: 14/541,428

(22) Filed: Nov. 14, 2014

(65) Prior Publication Data

US 2015/0145489 A1    May 28, 2015

(30) Foreign Application Priority Data

Nov. 22, 2013  (CN) .......................... 2013 1 0601257

(51) Int. Cl.
  *H02M 3/158*  (2006.01)
  *H03K 5/1536*  (2006.01)

(52) U.S. Cl.
  CPC .......... *H03K 5/1536* (2013.01); *H02M 3/158* (2013.01); *H02M 3/1588* (2013.01); *Y02B 70/1466* (2013.01)

(58) Field of Classification Search
  CPC ............................................. H02M 2001/0003
  See application file for complete search history.

(56) References Cited

U.S. PATENT DOCUMENTS

| 6,756,771 | B1 | 6/2004 | Ball et al. | |
|---|---|---|---|---|
| 7,558,037 | B1 * | 7/2009 | Gong | H02M 3/3376 361/111 |
| 7,598,715 | B1 * | 10/2009 | Hariman | H02M 3/1588 323/222 |
| 8,077,490 | B1 * | 12/2011 | Prodic | H02M 3/157 323/282 |

(Continued)

FOREIGN PATENT DOCUMENTS

CN    101476896 A    7/2009

OTHER PUBLICATIONS

Xiang Geng, Design of a Zero Crossing Detection Circuit, Sichuan Provincial Institute of electronics and semiconductor integrated technology committee, 2009 Annual Conference Papers, Jul. 8, 2009, pp. 199-203, Sichun, China.

*Primary Examiner* — Timothy J Dole
*Assistant Examiner* — Yusef Ahmed
(74) *Attorney, Agent, or Firm* — Michael C. Stephens, Jr.

(57) ABSTRACT

In one embodiment, a zero-crossing detection circuit for a synchronous step-down converter, can include: (i) a state determination circuit configured to compare a drain voltage of a synchronous transistor of the synchronous step-down converter against a reference voltage, and to generate a state digital signal indicative of whether a body diode of the synchronous transistor is turned on; (ii) a logic circuit configured to convert the state digital signal into a counting instruction signal; (iii) a plus-minus counter configured to generate a numerical signal in response to the counting instruction signal; (iv) a DAC configured to generate a correction analog signal based on the numerical signal; and (v) a zero-crossing comparator configured to receive the correction analog signal and the drain voltage of the synchronous transistor, and to provide a zero-crossing comparison signal to a driving circuit of the synchronous step-down converter.

8 Claims, 7 Drawing Sheets

(56) References Cited

U.S. PATENT DOCUMENTS

| | | | | |
|---|---|---|---|---|
| 8,242,763 B2* | 8/2012 | Pigott | H02M 3/1588 | 323/222 |
| 8,736,236 B2* | 5/2014 | Sun | H02M 7/2176 | 323/207 |
| 8,803,563 B2 | 8/2014 | Deng et al. | | |
| 2005/0057228 A1* | 3/2005 | Shih | H02M 1/38 | 323/222 |
| 2005/0128776 A1* | 6/2005 | Dequina | H02M 1/088 | 363/89 |
| 2006/0208716 A1* | 9/2006 | Chapuis | H02M 3/157 | 323/283 |
| 2006/0208717 A1* | 9/2006 | Shimizu | H02M 3/157 | 323/284 |
| 2007/0085520 A1* | 4/2007 | Ho | H02M 3/1588 | 323/282 |
| 2007/0201253 A1* | 8/2007 | Endo | H02M 7/217 | 363/127 |
| 2007/0268009 A1* | 11/2007 | Duan | H02M 3/157 | 323/282 |
| 2008/0036443 A1* | 2/2008 | Kojima | H02M 3/1588 | 323/351 |
| 2008/0191677 A1* | 8/2008 | Bacchi | H02M 3/156 | 323/282 |
| 2008/0298106 A1* | 12/2008 | Tateishi | H02M 3/1588 | 363/127 |
| 2009/0027024 A1* | 1/2009 | Dequina | H02M 1/38 | 323/283 |
| 2009/0146631 A1* | 6/2009 | Fukumori | H02M 3/1588 | 323/284 |
| 2009/0295350 A1* | 12/2009 | Yamada | H02M 3/1588 | 323/282 |
| 2009/0322303 A1* | 12/2009 | Hirata | H02M 3/156 | 323/284 |
| 2010/0156366 A1* | 6/2010 | Sakai | H02M 3/1588 | 323/282 |
| 2010/0246226 A1* | 9/2010 | Ku | H02M 1/4225 | 363/126 |
| 2011/0148377 A1* | 6/2011 | Schiff | H02M 3/1588 | 323/283 |
| 2011/0267015 A1* | 11/2011 | Lu | H02M 3/1588 | 323/235 |
| 2012/0032728 A1* | 2/2012 | Coleman | H02M 3/158 | 327/434 |
| 2012/0212195 A1* | 8/2012 | Kushida | H02M 3/1588 | 323/271 |
| 2012/0235653 A1* | 9/2012 | Chen | H02M 3/1588 | 323/271 |
| 2013/0215655 A1* | 8/2013 | Yang | H05B 33/0851 | 363/89 |
| 2013/0241461 A1 | 9/2013 | Huang | | |
| 2014/0009080 A1* | 1/2014 | Xu | H05B 33/0815 | 315/224 |
| 2014/0070781 A1* | 3/2014 | Yanagida | G05F 1/10 | 323/271 |
| 2014/0078788 A1* | 3/2014 | Yao | H02M 3/33592 | 363/21.14 |
| 2014/0111168 A1* | 4/2014 | Chen | H02M 3/1588 | 323/235 |
| 2014/0160601 A1* | 6/2014 | Ouyang | H02M 3/158 | 361/18 |
| 2014/0204625 A1* | 7/2014 | Liu | H02M 3/3372 | 363/21.13 |
| 2015/0102793 A1* | 4/2015 | Chen | H02M 3/1588 | 323/282 |
| 2015/0214829 A1* | 7/2015 | Xu | H02M 1/083 | 363/21.03 |

* cited by examiner

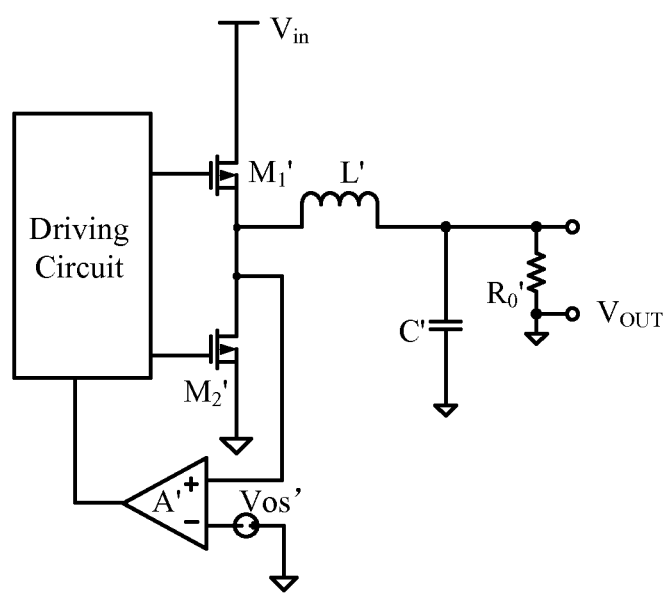
FIG. 1 (conventional)

ZERO-CROSSING DETECTION CIRCUIT AND METHOD FOR SYNCHRONOUS STEP-DOWN CONVERTER

RELATED APPLICATIONS

This application claims the benefit of Chinese Patent Application No. 201310601257.8, filed on Nov. 22, 2013, which is incorporated herein by reference in its entirety.

FIELD OF THE INVENTION

The present invention relates to regulation circuitry, and more particularly to zero-crossing detection circuits and associated methods for a synchronous step-down converter.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

SUMMARY

In one embodiment, a zero-crossing detection circuit for a synchronous step-down converter, can include: (i) a state determination circuit configured to compare a drain voltage of a synchronous transistor of the synchronous step-down converter against a reference voltage, and to generate a state digital signal indicative of whether a body diode of the synchronous transistor is turned on; (ii) a logic circuit configured to convert the state digital signal into a counting instruction signal; (iii) a plus-minus counter configured to generate a numerical signal in response to the counting instruction signal; (iv) a digital-analog converter (DAC) configured to generate a correction analog signal based on the numerical signal; and (v) a zero-crossing comparator configured to receive the correction analog signal and the drain voltage of the synchronous transistor, and to provide a zero-crossing comparison signal to a driving circuit of the synchronous step-down converter.

In one embodiment, a method can include: (i) providing an initial value of a plus-minus counter to a DAC, and generating a correction analog signal; (ii) triggering a zero-crossing comparator at an initial threshold point, turning off a synchronous transistor, comparing a reference voltage against a drain voltage of the synchronous transistor to determine a comparison result, and determining whether a body diode of the synchronous transistor is turned on according to the comparison result; (iii) converting, by a logic circuit, a state digital signal indicative of whether the body diode of the synchronous transistor is turned on to a counting instruction signal; (iv) executing, by the plus-minus counter, the counting instruction signal, and generating a numerical signal indicative of an offset correction amount; (v) converting, by the DAC, the numerical signal to a correction analog signal indicative of an actual offset correction amount; and (vi) providing the correction analog signal and the drain voltage of the synchronous transistor to the zero-crossing comparator, and a zero-crossing compari-son signal to a driving circuit of a synchronous step-down converter for turning off the synchronous transistor.

BRIEF DESCRIPTION OF THE DRAWINGS

FIG. 1 is a schematic block diagram of an example zero-crossing detection circuit.

DETAILED DESCRIPTION

Figure 2:
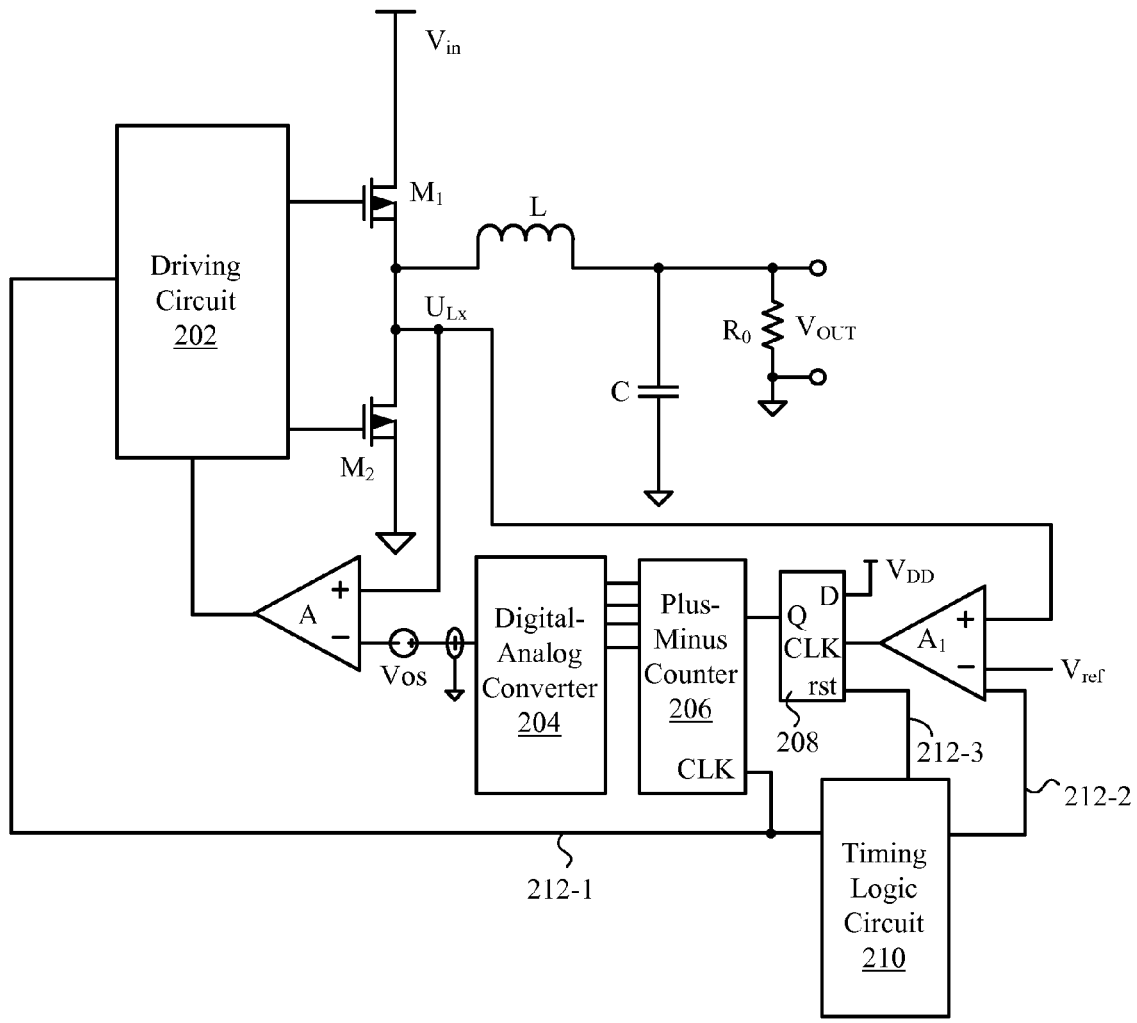
FIG. 2 is a schematic block diagram of a first example zero-crossing detection circuit for a synchronous step-down converter, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In a synchronous step-down converter, after a main switch (e.g., power transistor) is turned on at an initial time of each switching period, an inductor current may rise. Energy at an input terminal of the converter may be converted to magnetic energy to be stored in the inductor, and the main switch may be turned off after remaining on for a certain duty cycle. The inductor current may gradually decrease via a synchronous transistor, and the magnetic energy may be converted to electric energy to be released to an output terminal of the converter, thus completing a converter switching period. When a load (e.g., a light-emitting diode [LED], etc.) on the converter is relatively large, the inductor current may not return to zero during an entire switching cycle or period. In this case, the converter can generally operate in a continuous conduction mode (CCM). When the load is light, the inductor current may gradually decrease to zero during a "freewheeling" process of the synchronous transistor, and the synchronous transistor can be turned off. This can lower power consumption and improve conversion efficiency, and in this case, the converter can operate in a discontinuous conduction mode (DCM).

In DCM operation, a zero-crossing detection circuit may be utilized for determining whether the inductor current crosses zero. When the inductor current is detected to be zero by a zero-crossing comparator, the synchronous transistor may be turned off to lower power consumption, and to improve conversion efficiency. In some cases, a delay may exist in transmitting a control signal of the converter, and thus a threshold value may be set as part of the zero crossing detection. Because in practical applications, an offset voltage can be found in a zero-crossing comparator, transmission of the control signal for converter control can be delayed. Thus, offset voltage of the comparator and transmission delay of the control signal may be taken into consideration when setting the threshold value of the zero-crossing comparator.

Referring now to FIG. 1, shown is a schematic block diagram of an example zero-crossing detection circuit. When a zero-crossing detection circuit is configured for a step-down converter, the zero-crossing detection circuit may be implemented by utilising a zero-crossing comparator. For example, an input terminal of the zero-crossing comparator (e.g., A') can connect to a voltage source. When main switch $M_1'$ is turned on, a current of inductor L' can increase. After a certain duty cycle, main switch $M_1'$ may be turned off, and the current of inductor L' may gradually decrease through a freewheeling process of synchronous transistor $M_2'$. This can continue until the inductor current decreases to zero, and zero-crossing comparator A' provides a suitable comparison result to control the driving circuit to turn off synchronous transistor $M_2'$.

However, offset voltage Vos' can be found in the zero-crossing comparator. When used in high-power applications, though a resistance of synchronous transistor $M_2'$ may be relatively small (e.g., about 2 mΩ), a relatively large error can be generated due to the offset voltage (e.g., about ±10 mV). This can result in large variations of a zero-crossing point of the inductor current, which can cause the zero-crossing comparator to not be properly triggered under light load or no load conditions. In this case, the zero-crossing point may fail to be properly detected, such that the converter may operate in a "force" continuous conduction mode (Force CCM), and thus may increase power consumption.

In one embodiment, a zero-crossing detection circuit for a synchronous step-down converter, can include: (i) a state determination circuit configured to compare a drain voltage of a synchronous transistor of the synchronous step-down converter against a reference voltage, and to generate a state digital signal indicative of whether a body diode of the synchronous transistor is turned on; (ii) a logic circuit configured to convert the state digital signal into a counting instruction signal; (iii) a plus-minus counter configured to generate a numerical signal in response to the counting instruction signal; (iv) a digital-analog converter (DAC) configured to generate a correction analog signal based on the numerical signal; and (v) a zero-crossing comparator configured to receive the correction analog signal and the drain voltage of the synchronous transistor, and to provide a zero-crossing comparison signal to a driving circuit of the synchronous step-down converter.

Referring now to FIG. 2, shown is a schematic block diagram of a first example zero-crossing detection circuit for a synchronous step-down converter, in accordance with embodiments of the present invention. In this example, comparator $A_1$ can be utilized as a state determination circuit to determine whether a body diode of synchronous transistor $M_2$ conducts or is turned on. After zero-crossing comparator A is triggered, synchronous transistor $M_2$ may be turned off by driving circuit 202. Comparator $A_1$ can detect drain voltage $U_{Lx}$ during a sampling time period, and may compare drain voltage $U_{Lx}$ against reference voltage $V_{ref}$.

When the body diode of synchronous transistor $M_2$ conducts, a voltage drop may be about 0.7V, so reference voltage $V_{ref}$ can be set to be in a range of from about −0.3 to about −0.5V, or from about +0.3 to about +0.5V. If an inductor current has a positive direction from left to right as the circuit is shown, when the body diode conducts, drain voltage $U_{Lx}$ may be approximately −0.7V, and may be provided to a non-inverting input terminal of comparator $A_1$. Reference voltage $V_{ref}$ may be set as about −0.4V, and can be provided to an inverting input terminal of comparator $A_1$. Because a voltage at the non-inverting input terminal is less than that at the inverting input terminal, comparator $A_1$ can output a low level state digital signal. Otherwise, comparator $A_1$ can output a high level state digital signal.

The logic circuit can include D flip-flop 208 having a D terminal for receiving a high level, a clock terminal (CLK) for receiving the state digital signal, and a reset terminal (rst) for receiving timing signal 212-2. When the state digital signal is low, a counting instruction signal generated at output terminal Q may be 0, and this may be provided to plus-minus counter 206. For example, if the counting instruction signal is 0, plus-minus counter 206 may subtract one, and if the counting instruction signal is 1, plus-minus counter 206 may add one. Of course, other counting operations and/or configurations can be supported in particular embodiments.

If the body diode of synchronous transistor $M_2$ conducts, the zero-crossing detection threshold value may be positive, the counting instruction signal can be 0, and plus-minus counter 206 may execute the instruction of subtracting one. In this case, the correction analog signal provided to digital-analog converter 204 can be lowered, and the zero-crossing threshold value can be lowered. After one or more periods/cycles, when the body diode is detected as shutdown (not conducting), the zero-crossing threshold value may be negative. In this case, the counting instruction signal may be 1, plus-minus counter 206 can the instruction of adding one, and this may increase the zero-crossing threshold value. Therefore, the threshold value can fluctuate around zero to realize dynamic equilibrium.

Offset voltage Vos can occur in zero-crossing comparator A, and Vos can be coupled to the non-inverting input terminal or the inverting input terminal of zero-crossing comparator A. In the example of FIG. 2, zero-crossing detection may be realized by comparing voltage $U_{Lx}$ at the non-inverting input terminal against a sum of offset voltage Vos and the correction analog signal at the inverting input terminal. An improved correction result can be achieved as the sum of offset voltage Vos and the correction analog signal becomes closer to zero. After voltage $U_{Lx}$ crosses zero, the zero-crossing comparison signal can used by driving circuit 202 to turn off synchronous transistor $M_2$.

Figure 6:
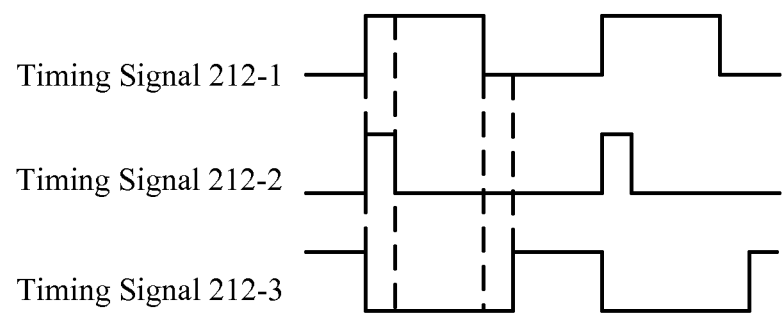
FIG. 6 is a waveform diagram of example timing signals of a zero-crossing detection circuit, in accordance with embodiments of the present invention.

Driving circuit 202 can provide timing signal 212-1 to plus-minus counter 206. Timing signals 212-2 and 212-3 can be generated by timing logic circuit 210 from timing signal 212-1. For example, timing signal 212-2 can go high at substantially the same time as timing signal 212-1 going high. Timing signal 212-2 can remain high for a certain time period (e.g., a predetermined duration), which indicates the operation time (e.g., enabled time) of comparator $A_1$. Timing signal 212-3 can go low at substantially the same time as timing signal 212-1 going high. Timing signal 212-3 can remain low for a certain time period (e.g., a predetermined counting time), during which the logic circuit (e.g., flip-flop 208) is enabled. When timing signal 212-3 goes high, D flip-flop 208 can be reset (see, e.g., FIG. 6 for example waveforms of timing signals 212-1, 212-2, and 212-3).

Figure 3:
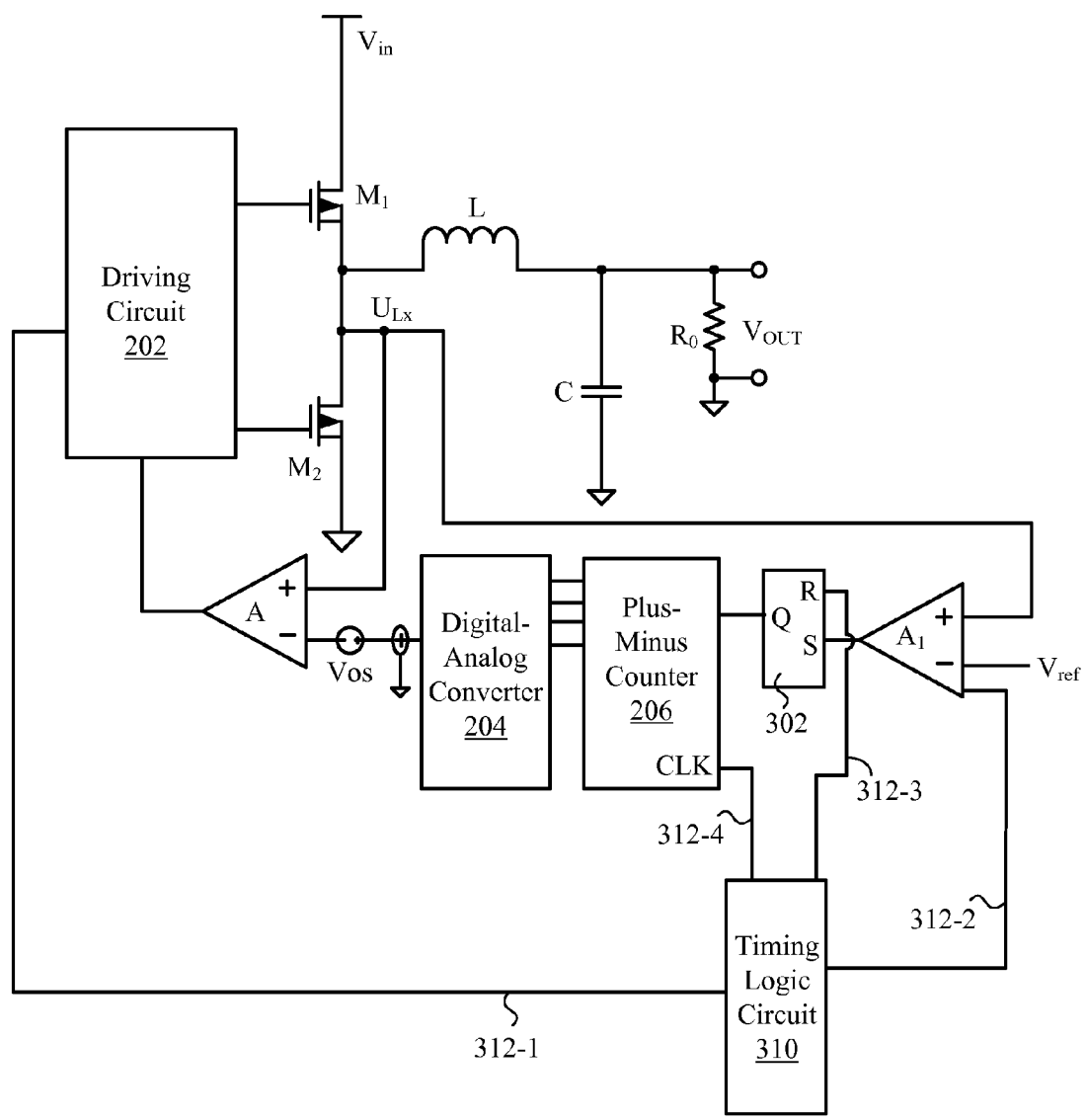
FIG. 3 is a schematic block diagram of a second example zero-crossing detection circuit for a synchronous step-down converter, in accordance with embodiments of the present invention.

Referring now to FIG. 3, shown is a schematic block diagram of a second example zero-crossing detection circuit for a synchronous step-down converter, in accordance with embodiments of the present invention. Here, the logic circuit, timing logic circuit 310, and the timing signals may be different from those of the above example. The logic circuit in this example can include RS flip-flop 302 having an S terminal for receiving the state digital signal, an R terminal for receiving timing signal 312-3, and an output terminal for providing the counting instruction signal to plus-minus counter 206.

Timing signal 312-1 may be generated by driving circuit 202, and provided to timing logic circuit 310. Timing logic circuit 310 can utilize timing signal 312-1 to generate timing signal 312-2 for comparator $A_1$, timing signal 312-3 for flip-flop 302, and timing signal 312-4 for plus-minus counter 206 (e.g., at a CLK input). Timing signal 312-2 can go high at substantially the same time as timing signal 312-1 going high. Timing signal 312-2 may remain high for a certain time period or predetermined time duration that indicates the operation time (e.g., enabling) of comparator $A_1$. Timing signal 312-3 can go low at substantially the same time as timing signal 312-1 going high. Timing signal 312-3 can remain low for a certain time period (e.g., a predetermined counting time) during which the logic circuit (e.g., flip-flop 302) is disabled or reset. Also, timing signal 312-4 can go low along with timing signal 312-3, and can remain low for a certain time less than that of timing signal 312-3.

The circuit structure of providing three timing signals generated from timing signal 312-1 via timing logic circuit 310 to comparator $A_1$, logic circuit 302, and plus-minus counter 206 in the second example (see, e.g., FIG. 3) can also be applied to the first example (see, e.g., FIG. 2). Timing logic circuit 310 of the second example can be modified relative to that of the first example (timing logic circuit 210) for generating the timing signals in this particular. Similarly, the circuit structure for providing timing signal 312-1 to plus-minus counter 206, providing timing signal 312-2 to comparator $A_1$, and providing timing signal 312-3 to the logic circuit may be substantially the same in both examples.

Figure 4:
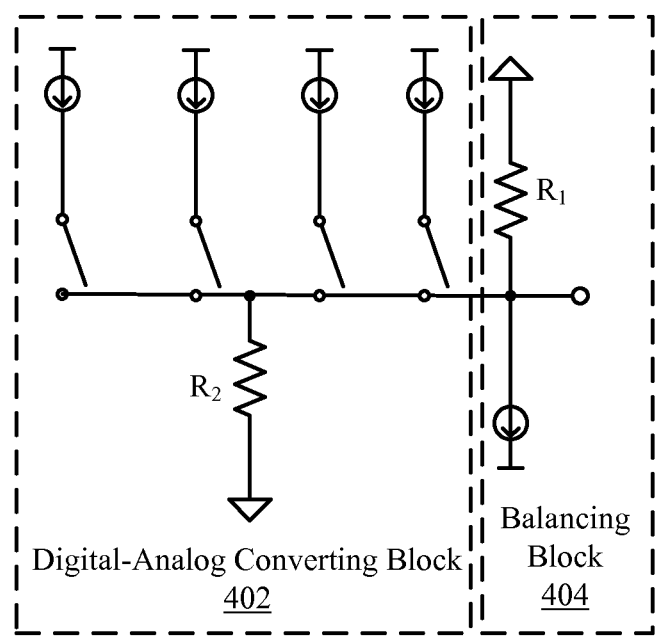
FIG. 4 is a schematic block diagram of an example digital-analog converter, in accordance with embodiments of the present invention.

Referring now to FIG. 4, shown is a schematic block diagram of an example digital-analog converter, in accordance with embodiments of the present invention. In this example, digital-analog converter 204 can include digital-analog converting block 402 and balancing block 404. Balancing block 404 can include resistor $R_1$ having a first terminal connected to a DC current source and to digital-analog converting block 402, and a second terminal coupled to ground. As the output of digital-analog converting block 402 may be substantially constant positive or substantially constant negative, the correction range may be limited, and a signal can be optimized by balancing block 404 to form the correction analog signal. In this way, positive-negative correction in a certain range can be achieved such that zero-crossing detection may be dynamically balanced at the zero-crossing point. Also, the current direction of the DC current source may be opposite to that of digital-analog converting block 402. Also, balancing block 404 and digital-analog converting block 402 in the first example (see, e.g., FIG. 2) or the second example (see, e.g., FIG. 3) can be respectively coupled to different input terminals of zero-crossing comparator A. In one case, the current source of balancing block 404 may have the same direction as digital-analog converting block 402.

Figure 5:
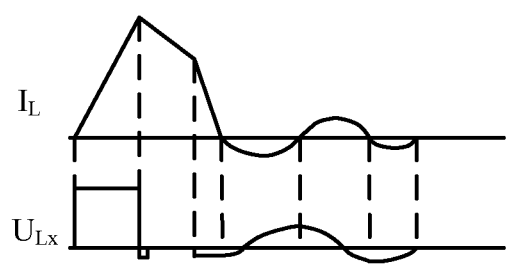
FIG. 5 is a waveform diagram showing example operation of a zero-crossing detection circuit, in accordance with embodiments of the present invention.

Referring now to FIG. 5, shown is a waveform diagram showing example operation of a zero-crossing detection circuit, in accordance with embodiments of the present invention. If the inductor current is in a positive direction from left to right in this diagram, when inductor current $I_L$ is positive, the body diode of synchronous transistor $M_2$ can conduct, and the drain voltage of the synchronous transistor may be about −0.7. In this case, reference voltage $V_{ref}$ may be set in a range of from about −0.3 to about −0.5V, and may be provided to comparator $A_1$ along with voltage $U_{Lx}$. If voltage $U_{Lx}$ is less than reference voltage $V_{ref}$ (e.g., from about −0.3 to about −0.5V), the body diode may be conducting, and inductor current $I_L$ may be positive. If voltage $U_{Lx}$ is greater than reference voltage $V_{ref}$ (e.g., from about −0.3 to about −0.5V), the body diode may be shutdown (not conducting), and inductor current $I_L$ may be negative.

According to this determination result, comparator $A_1$ can output a state digital signal indicative of whether the body diode of synchronous transistor $M_2$ conducts. For example, a "0" output from comparator $A_1$ may represent body diode conduction (inductor current $I_L$ is positive), "1" output from comparator $A_1$ may represent body diode shutdown (inductor current $I_L$ is negative). Also, a corresponding counting instruction signal may be generated through logic conversion by the logic circuit (e.g., 208/302). For example, if a four-bit plus-minus counter is employed, the initial value of plus-minus counter 206 can be set as (1000). The counting instruction signal may be executed for an operation of adding one or subtracting one, and a binary digital signal indicative of an offset correction value may be provided. For example, the binary digital signal may be (1001) if adding one to the initial value, and the binary digital signal may be (0111) if subtracting one from the initial value.

The initial value of plus-minus counter 206 can be optimized because if offset voltage is too large, the circuit may be forced to operate in CCM. In such a case, the zero-crossing point may not be detected if the offset voltage is negative and relatively large, and the voltage $U_{Lx}$ may not reach the sum of the offset voltage and the correction analog signal. To address this problem, the initial value of plus-minus counter 206 can be set as a maximum value (e.g., 1111), to ensure that the zero-crossing point can be detected and the circuit can be automatically corrected. If the offset voltage is positive and relatively large, voltage ULx may not reach the sum of the offset voltage and the correction analog signal, and in this case the initial value of plus-minus counter 206 may be accordingly set as a minimum value (e.g., 0000).

In order to improve the correction validity, an offset voltage test may be made on the zero-crossing comparator, and the offset voltage may be determined in a range of normal distribution by any suitable statistical methods (e.g., variance). For example, determining the offset voltage may be completed before setting the initial value of plus-minus counter 206. After making digital-analog conversion on the binary digital signal by DAC 204, the correction analog signal indicative of a practical offset correction value may be obtained.

As offset voltage Vos can occur in zero-crossing comparator A, offset voltage Vos can connect to the non-inverting input terminal or inverting input terminal of the zero-crossing comparator. Therefore, as shown in FIG. 2, zero-crossing detection may be realized by comparing voltage $U_{Lx}$ at the non-inverting input terminal against a sum of offset voltage Vos and the correction analog signal at the inverting input terminal. Further, better correction results can be achieved as the sum of offset voltage Vos and the correction analog signal get closer to zero. After the voltage $U_{Lx}$ crosses zero, the zero-crossing comparison signal can be activated to driving circuit 202 for turning off synchronous transistor $M_2$, and entering zero-crossing detection in the next period/cycle.

In the example of FIG. 3, timing signal 212-1 may be generated by driving circuit 202, and may be converted by timing logic circuit 310 to provide timing signal 312-2 to comparator $A_1$, timing signal 312-3 to flip-flop 302, and timing signal 312-4 to plus-minus counter 206. In addition, the output of digital-analog converting block 402 in FIG. 4 can be, e.g., +0.1V, +0.2V, +0.3V, +0.4V, etc., and the voltage of balancing block 404 can be regulated to be, e.g., about −0.25V by multiplying the current source and resistor $R_1$. This can be added with the output of digital-analog converting block 402, and thus the correction analog signal can be, e.g., −0.15V, −0.05V, +0.05V, +0.15V, etc. Thus, comparator A can be regulated in both positive and negative directions in order to achieve wider correction scope and higher accuracy.

In one embodiment, a method can include: (i) providing an initial value of a plus-minus counter to a DAC, and generating a correction analog signal; (ii) triggering a zero-crossing comparator at an initial threshold point, turning off a synchronous transistor, comparing a reference voltage against a drain voltage of the synchronous transistor to determine a comparison result, and determining whether a body diode of the synchronous transistor is turned on according to the comparison result; (iii) converting, by a logic circuit, a state digital signal indicative of whether the body diode of the synchronous transistor is turned on to a counting instruction signal; (iv) executing, by the plus-minus counter, the counting instruction signal, and generating a numerical signal indicative of an offset correction amount; (v) converting, by the DAC, the numerical signal to a correction analog signal indicative of an actual offset correction amount; and (vi) providing the correction analog signal and the drain voltage of the synchronous transistor to the zero-crossing comparator, and a zero-crossing comparison signal to a driving circuit of a synchronous step-down converter for turning off the synchronous transistor.

Figure 7:
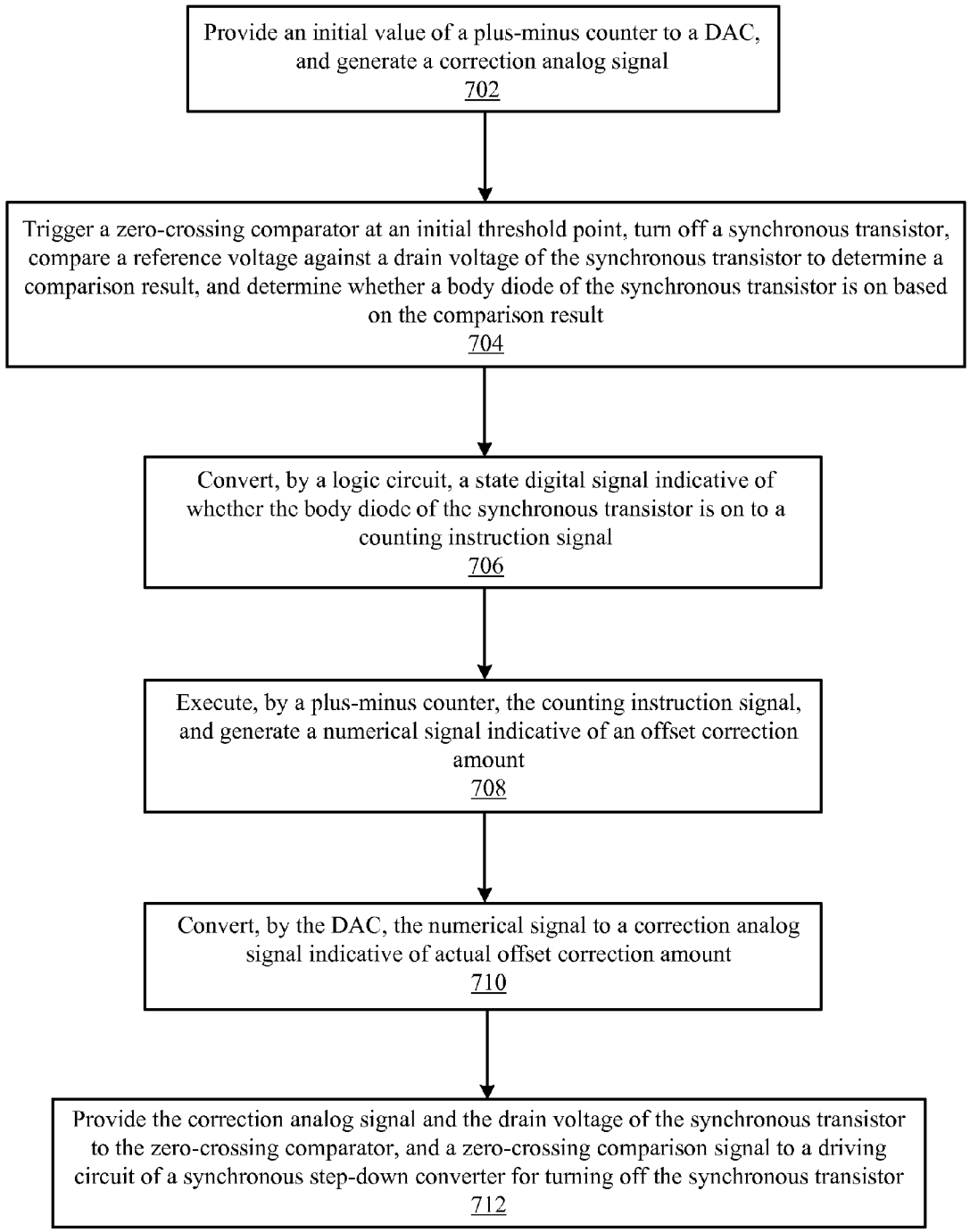
FIG. 7 is a flow diagram of a timing signals of a zero-crossing detection method for a synchronous step-down converter, in accordance with embodiments of the present invention.

Referring now to FIG. 7, shown is a flow diagram of a timing signals of a zero-crossing detection method for a synchronous step-down converter, in accordance with embodiments of the present invention. At 702, an initial value of a plus-minus counter (e.g., 206) can be provided to a DAC (e.g., 204), and a correction analog signal can be generated. At 704, a zero-crossing comparator (e.g., A) can be triggered at an initial threshold point, a synchronous transistor (e.g., $M_2$) can be turned off, a reference voltage (e.g., $V_{ref}$) can be compared against a drain voltage of the synchronous transistor to determine a comparison result, and whether a body diode of the synchronous transistor is turned on can be determined according to the comparison result.

At 706, by a logic circuit (e.g., including flip-flop 208/302), a state digital signal indicative of whether the body diode of the synchronous transistor is turned on can be converted to a counting instruction signal. At 708, by the plus-minus counter (e.g., 206), the counting instruction signal can be executed, and a numerical signal indicative of an offset correction amount can be generated. At 710, by the DAC, the numerical signal can be converted to a correction analog signal indicative of an actual offset correction amount. At 712, the correction analog signal and the drain voltage of the synchronous transistor can be provided to the zero-crossing comparator (e.g., A), and a zero-crossing comparison signal can be provided to a driving circuit (e.g., 202) of a synchronous step-down converter for turning off the synchronous transistor (e.g., $M_2$).

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A zero-crossing detection circuit for a synchronous step-down converter, the zero-crossing detection circuit comprising:
   a) a state determination circuit configured to compare a drain voltage of a synchronous transistor of said synchronous step-down converter against a reference voltage, and to generate a state digital signal indicative of whether a body diode of said synchronous transistor is turned on;
   b) a logic circuit configured to convert said state digital signal into a counting instruction signal;
   c) a plus-minus counter configured to generate a numerical signal in response to said counting instruction signal;
   d) a digital-analog converter configured to generate a correction analog signal based on said numerical signal;
   e) a zero-crossing comparator configured to receive said correction analog signal and said drain voltage of said synchronous transistor, and to provide a zero-crossing comparison signal to a driving circuit of said synchronous step-down converter; and
   f) a timing logic circuit configured to receive a first timing signal from said driving circuit, and to generate a second timing signal indicative of an operation time of a comparator, and a third timing signal indicative of an operation time of said logic circuit, wherein said second and third timing signals are respectively provided to said comparator and said logic circuit, and said first timing signal is provided to said plus-minus counter.

2. The zero-crossing detection circuit of claim 1, wherein said state determination circuit comprises said comparator configured to compare said drain voltage of said synchronous transistor against said reference voltage.

3. The zero-crossing detection circuit of claim 1, wherein said timing logic circuit is configured to receive said first timing signal, and to generate said second and third timing signals, and a fourth timing signal indicative of an operation time of said plus-minus counter.

4. The zero-crossing detection circuit of claim 1, wherein said logic circuit comprises a D flip-flop having a D terminal configured to receive a high level, a clock terminal configured to receive said state digital signal, a reset terminal configured to receive said third timing signal, and an output terminal configured to provide said counting instruction signal.

5. The zero-crossing detection circuit of claim 1, wherein said logic circuit comprises a RS flip-flop having an S terminal configured to receive said state digital signal, an R terminal configured to receive third timing signal, and an output terminal configured to provide said counting instruction signal.

6. The zero-crossing detection circuit of claim 1, wherein said digital-analog converter comprises a digital-analog converting block and a balancing block, said balancing block comprising a resistor coupled to ground, to a DC current source and said digital-analog converting block, and wherein said DC current source comprises a current direction that is opposite to a current direction in said digital-analog converting block.

7. A zero-crossing detection method for a synchronous step-down converter, the method comprising:
 a) providing an initial value of a plus-minus counter to a digital-analog converter, and generating a correction analog signal via digital-analog conversion;
 b) triggering a zero-crossing comparator at an initial threshold point, turning off a synchronous transistor, comparing a reference voltage against a drain voltage of said synchronous transistor to determine a comparison result, and determining whether a body diode of said synchronous transistor is turned on according to said comparison result;
 c) converting, by a logic circuit, a state digital signal indicative of whether said body diode of said synchronous transistor is turned on to a counting instruction signal;
 d) executing, by said plus-minus counter, said counting instruction signal, and generating a numerical signal indicative of an offset correction amount;
 e) converting, by said digital-analog converter, said numerical signal to a correction analog signal indicative of an actual offset correction amount;
 f) providing said correction analog signal and said drain voltage of said synchronous transistor to said zero-crossing comparator, and a zero-crossing comparison signal to a driving circuit of said synchronous step-down converter for turning off said synchronous transistor; and
 g) receiving, by a timing logic circuit, a first timing signal from said driving circuit, generating a second timing signal indicative of an operation time of a comparator, and a third timing signal indicative of an operation time of said logic circuit, wherein said second and third timing signals are respectively provided to said comparator and said logic circuit, and said first timing signal is provided to said plus-minus counter.

8. The method of claim 7, wherein said digital-analog converter comprises a digital-analog converting block and a balancing block, said balancing block comprising a resistor coupled to ground, to a DC current source and said digital-analog converting block, and wherein said DC current source comprises a current direction that is opposite to a current direction in said digital-analog converting block.

* * * * *